: 
United States Patent [19]

Kuo et al.

[11] Patent Number: 5,576,988
[45] Date of Patent: Nov. 19, 1996

[54] SECURE NON-VOLATILE MEMORY ARRAY

[75] Inventors: Max C. Kuo, San Leandro; James M. Jaffe, Santa Clara, both of Calif.

[73] Assignee: National Semiconductor Corporation, Santa Clara, Calif.

[21] Appl. No.: 430,017

[22] Filed: Apr. 27, 1995

[51] Int. Cl.$^6$ .......................... G11C 16/02; H01L 29/788
[52] U.S. Cl. ................................ 365/185.04; 365/185.12; 257/316; 257/922
[58] Field of Search ........................ 365/185.04, 185.12; 257/922, 316, 317

[56] References Cited

U.S. PATENT DOCUMENTS

| | | | |
|---|---|---|---|
| 4,953,129 | 8/1990 | Kobayashi | 365/185.12 |
| 4,962,484 | 10/1990 | Takeshima | 365/185.04 |
| 5,132,928 | 7/1992 | Hayashikoshi | 365/185.12 |
| 5,291,434 | 3/1994 | Kowalski | 257/922 |

Primary Examiner—David C. Nelms
Assistant Examiner—Son Mai
Attorney, Agent, or Firm—Skjerven, Morrill, MacPherson, Franklin & Friel; William L. Paradice; Paul J. Winters

[57] ABSTRACT

An improved EEPROM structure is disclosed which provides protection against external detection of data stored within the array's memory cells via microprobing by causing the array's word lines to de-activate upon an attempted deprocessing of the array. An EEPROM "protect" cell is connected in parallel between each word line within the array and ground potential. Each of these protect cells has formed therein one or more substantially vertical cavities filled with a high etching film. These cavities are provided in a region adjacent to an end of the protect cell's floating gate such that during an attempted deprocessing of the array using an etching process in order to expose the array's word, bit, and control lines for microprobing, the etchant will rapidly diffuse through these cavities, exposing and discharging the floating gate before fully exposing the word, bit, and control lines. Once discharged, each protect cell shorts its associated word line to ground potential. Holding the word lines at ground potential in such a manner precludes the activation of the word lines and, therefore, effectively prevents the external reading of data stored within the array via microprobing.

24 Claims, 10 Drawing Sheets

SECURE NON-VOLATILE MEMORY ARRAY

CROSS REFERENCES TO RELATED APPLICATIONS

This application is related to U.S. patent application Ser. No. 08/251,230 entitled "SECURE NONVOLATILE MEMORY CELL" filed on May 31, 1994 and herein incorporated by reference.

FIELD OF THE INVENTION

The present invention relates to memory devices. More particularly, the present invention relates to an improved memory array which prevents detection of data stored in memory cells provided within the array.

BACKGROUND

Electrically erasable memory cells (e.g., EEPROM cells) store binary data in the form of charge accumulation on a floating gate. EEPROMs are able to change between binary states by transferring charge between the drain and the floating gate by way of electron tunneling. This tunneling allows EEPROMs to be electrically programmable, erasable, and readable by the selective application of potential across the control gate, the drain, and the source.

Figure 1:
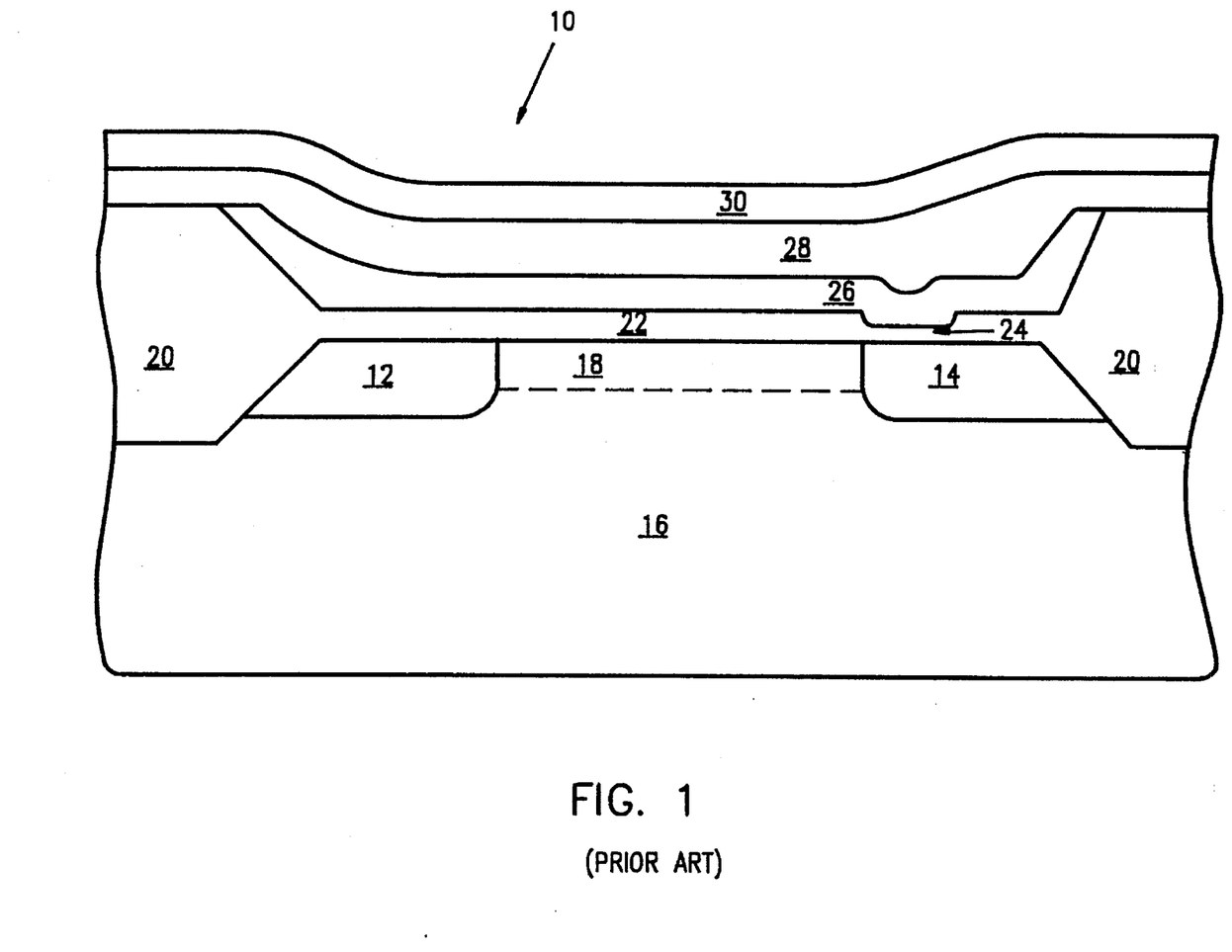
FIG. 1 is a cross-sectional view of a typical prior art EEPROM cell.

A typical prior art EEPROM cell is shown and described in U.S. Pat. No. 4,377,857 to Tickle. Such a prior art EEPROM cell is shown in FIG. 1. Cell 10 has source 12 and drain 14 regions formed in silicon substrate 16. Channel region 18 extends between source 12 and drain 14. Substrate 16 is of a conductivity type opposite to that of source 12 and drain 14. Field oxide 20 is provided to insulate cell 10 from adjacent cells (not shown). Gate oxide 22 insulates polycrystalline floating gate 26 from substrate 16 and channel 18. A very thin layer of tunnel oxide 24 insulates a portion of floating gate 26 from drain 14 and allows for the tunneling of electrons between floating gate 26 and drain 14. Insulating layer 28 insulates control gate 30 from floating gate 26. Cell 10 typically has a threshold voltage of approximately 1.5 volts when in its neutral state.

Figure 2:
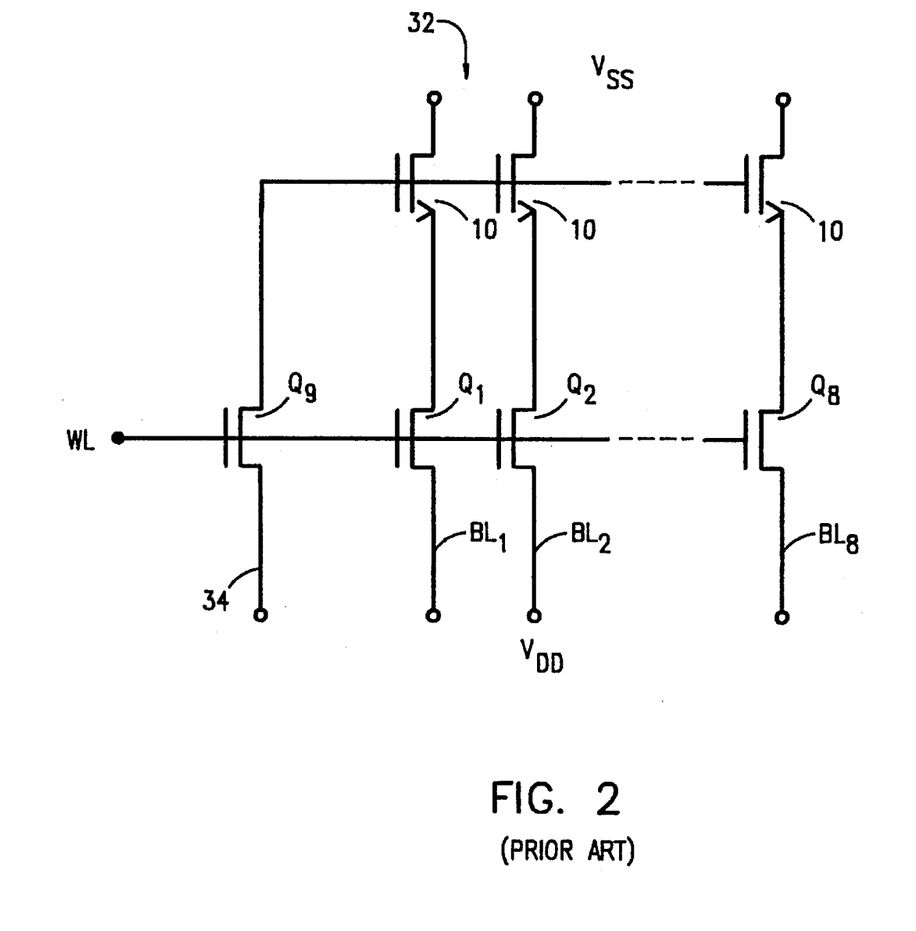
FIG. 2 is a typical prior art memory array containing the EEPROM cell of FIG. 1.

FIG. 2 shows a portion of a conventional memory array 32 having EEPROM cells such as cells 10 of FIG. 1 arranged in eight columns (for simplicity, not all eight columns are shown). The sources of cells 10 are connected to a voltage supply $V_{ss}$ which is typically set at ground potential. The drain of each cell 10 is connected to an associated one of bit lines $BL_1$–$BL_8$ via select transistors $Q_1$–$Q_8$, respectively. The gates of cells 10a–10h are connected to a control line 34 via control transistor $Q_9$. The gates of select transistors $Q_1$–$Q_8$ and control transistor $Q_9$ are coupled to a word line WL.

Referring also to FIG. 1, binary data is represented in cells 10 by the presence or absence of charge stored on floating gate 26 (FIG. 1), where a charged state is indicative of a binary "1" and an uncharged state is indicative of a binary "0". To charge, or erase, one of such EEPROM cells, a high voltage (e.g., 15 V) is applied to control gate 30 while drain 14 is grounded. Electrons tunnel from drain 14 to floating gate 26, resulting in an accumulation of negative charge on floating gate 26. This charge accumulation increases cell 10's threshold voltage such that when a read voltage is applied to control gate 30, cell 10 will not conduct.

To discharge, or program, one of cells 10, control gate 30 is grounded while a high voltage (e.g., 13 V) is applied to drain 14. Electrons tunnel from floating gate 26 to drain 14, thereby discharging floating gate 26 and lowering the threshold voltage of cell 10 such that cell 10 will conduct when a read voltage is applied to control gate 30.

Data stored in cells 10 is read as follows. Word line WL is pulled to approximately 5 volts while bit lines $BL_1$–$BL_8$ are held at approximately 1.5–1.7 volts. A read voltage of approximately 2.5 volts is then applied to control gate 30 of cells 10 via control line 34. Those cells 10 having an uncharged floating gate 26 will conduct while those cells 10 having a charged floating gate 26 will not conduct. Thus, the binary state of cells 10 may be determined by sensing current flow on bit lines $BL_1$–$BL_8$.

Where the stored data is highly sensitive or confidential, internal access to cells 10 may be inhibited via security circuitry such that only authorized persons are able to read the contents of cell 10.

However, data stored in array 32 is susceptible to unauthorized external reading by charge detection and microprobing techniques. In a typical charge detection technique, array 32 is deprocessed to directly ascertain whether any charge is present on floating gate 26 of each cell 10. For instance, control gate 30 of each cell 10 can be removed using any suitable etchant, thereby allowing one to directly determine whether charge is present on floating gate 26 (using a charge detector or scanning device) of each cell 10 and, hence, to ascertain the binary state of each cell 10.

Second, array 32 may be deprocessed to remove all passivation layers such that word lines WL, control lines 34, and bit lines $BL_1$–$BL_8$ of array 32 are exposed for microprobing. Using any conventional microprobe or equivalent, appropriate read voltages may then be applied to the respective word, control, and bit lines to access and determine the binary state of each cell 10 within array 32 via current sensing as discussed above. Conventional internal security circuitry does not preclude electrically reading the contents of array 32 in such a way.

Thus, in order to fully protect data stored in such a non-volatile memory array, both the array and the individual memory Cells contained therein should be protected against unauthorized external detection via microprobing and charge detection, respectively.

SUMMARY

Improved EEPROM cell and array structures are disclosed which provide protection against unauthorized external reading of data stored in the array's memory cells. The EEPROM cell disclosed herein prevents detection of charge stored within the cell by causing any stored charge to dissipate upon an attempted deprocessing of the cell. In one embodiment of the present invention, a sliver region is provided at the end of the floating gate and extends laterally beyond the end of the control gate. This sliver region feature enhances security of the cell as follows. In order to gain access to and determine the binary state of the floating gate, the control gate must first be removed using, for example, a plasma or chemical deprocessing etchant. Since this sliver region extends just beyond the control gate and is covered only by a thin insulation layer ;(after removal of overlying glass layers), any etchant reaching the control gate will simultaneously attack the thin layer and expose the sliver region of the floating gate prior to etching through the control gate. Since etchants used to deprocess semiconductor cells necessarily contain ions, exposure of the floating gate to such an etchant will cause any charge stored on the floating gate to dissipate. Thus, any charge once present on the floating gate will have been dissipated before the control gate can be removed, thereby making it impossible to determine the correct binary state of the cell prior to the attempted deprocessing.

In another embodiment of the present invention, one or more cavities extending in a substantially vertical direction are positioned in a region adjacent to the floating gate and the control gate. These cavities are filled with a film having a high etching rate. During an attempted deprocessing of the cell using at etchant, the etchant will simultaneously attack both the insulating material overlying the control gate and the film within these substantially vertical cavities. Since this film preferably has a very high etching rate, the etchant will rapidly diffuse (vertically as well as horizontally) through these cavities, reaching the floating gate via the cavities before reaching and ultimately removing the control gate via the insulating layers overlying the control gate. Thus, any etchant applied in an attempted deprocessing of a memory cell containing these cavities will expose and discharge the floating gate before the control gate can be removed.

The memory array disclosed herein prevents one from externally reading the data stored within the array via microprobing by causing the array's word lines to de-activate upon an attempted deprocessing of the array. In yet another embodiment of the present invention, an EEPROM "protect" cell is connected in parallel between each word line within the array and ground potential. These protect cells are identical to the EEPROM cells of the above-mentioned embodiments except that the protect cells are depletion-type MOS devices.

As mentioned above, in order to externally read data stored within a memory array, the array must first be deprocessed to expose the word, bit, and control lines. Once these lines are exposed, data stored within the array may be accessed by applying the appropriate read voltages to the word, bit, and control lines using, for example, a micro-probe.

In accordance with the present invention, the floating gates of the protect cells are charged during the initial power-up of the array, thereby increasing the threshold voltage of the protect cells such that they will remain in a non-conducting state during normal operation of the array. Upon an attempted deprocessing of the array to gain access to the word, bit, and control lines, the deprocessing etchants will reach, expose, and discharge the floating gates of the protect cells (as discussed above via the sliver region and/or the cavities) before exposing the word, bit, and control lines. Once discharged, each protect cell turns on and forms a short circuit between its respective word line and ground potential, thereby pulling down the word line to ground potential. Holding the word lines at ground potential in such a manner precludes the activation of the word lines and, therefore, effectively prevents the external reading of data stored within the array.

It is important that once discharged the protect cells remain on and maintain the word lines at ground potential. Thus, a diode is connected between the control gate of each protect cell and ground potential to clamp, in a negative direction, the control gate voltage of the protect cell at approximately −0.6 volts. As such, the diode ensures that the application of a negative voltage to the control gates of the protect cells will be ineffective in turning off the protect cells.

BRIEF DESCRIPTION OF THE DRAWINGS

These and other features, aspects, and advantages of the present invention will become better understood with regard to the following description, appended claims, and drawings where:

FIG. 13 is a plan view of another portion of the memory array of FIG. 11.

DETAILED DESCRIPTION OF THE PREFERRED EMBODIMENT

Figure 3:
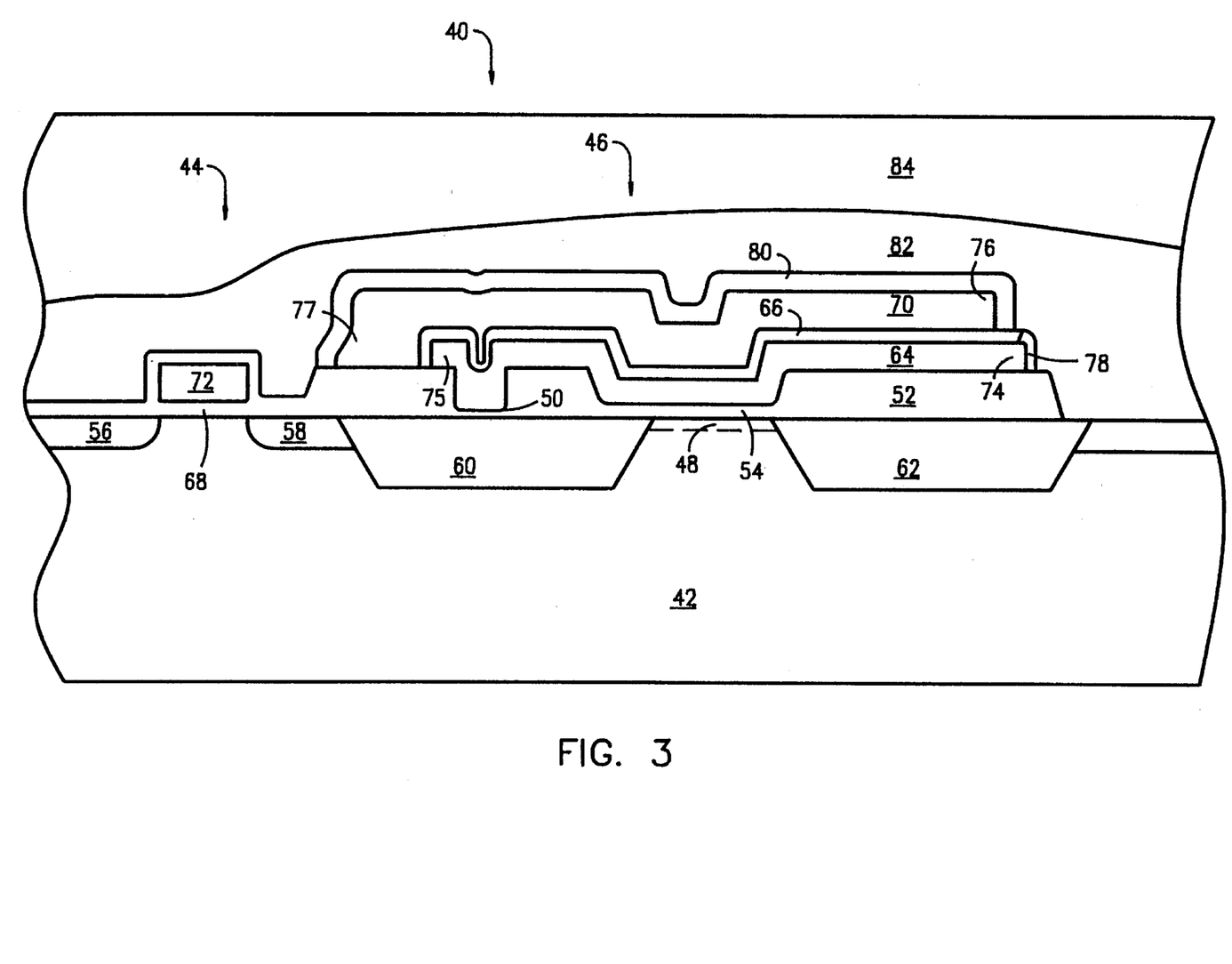
FIG. 3 is a cross-sectional view of an EEPROM cell in accordance with one embodiment of the present invention.
Figure 4:
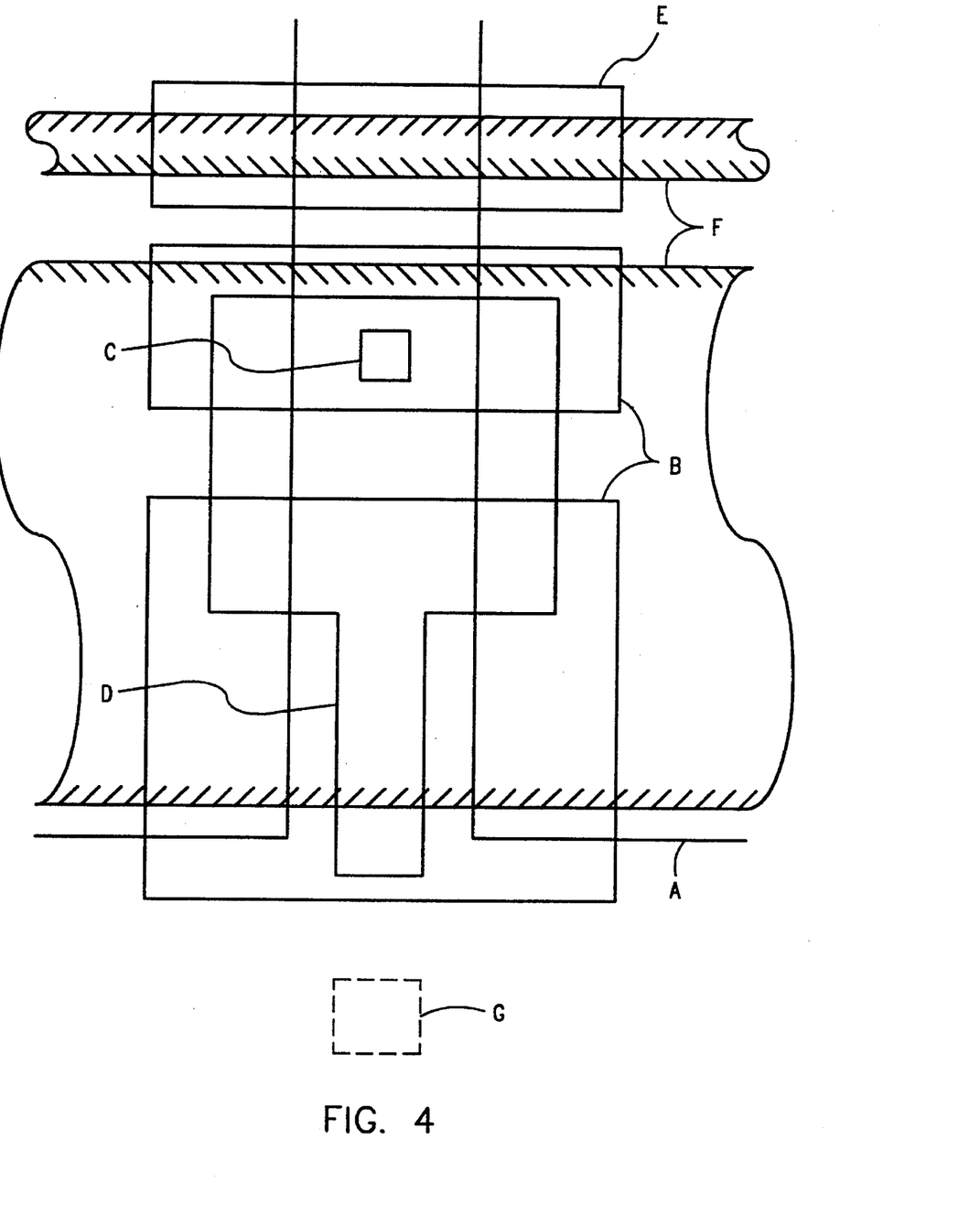
FIG. 4 is a plan view of an EEPROM cell shown in FIG. 3.

FIG. 3 shows an EEPROM memory cell in accordance with a preferred embodiment of the present invention. The reading, erasing, and programming operations of cell 40 are similar to those of conventional EEPROM cells and hence will not be described below. Cell 40 is provided on substrate 42 and includes select transistor 44 and storage transistor 46. Referring also to FIG. 4, composite masking layer A and a P-type masking layer (not shown) are used to dope substrate 42 with a P-type dopant. Although substrate 42 is shown as a separate body, it could be part of a larger semiconductor body. In another embodiment, substrate 42 may also comprise a P-type well region formed as part of a larger CMOS structure.

A thick electrically insulating field region 52 having a thickness between 400–500 nm is formed along the surface of substrate 42. Although field region 52 is preferably silicon dioxide, field region 52 may be any other suitable insulating material. Masking layer B, along with tunnel mask C, is used to define channel region 48 and tunneling window 50, as well as junction areas 60 and 62 (which will become source and drain regions, respectively). Gate oxide layer 54, continuous with field region 52, is provided along the surface of substrate 42 above channel region 48. Gate oxide layer 54 is approximately 40 nm thick. A very thin tunnel oxide layer (8.3 nm thick) continuous with field region 52 is provided in tunneling region 50.

Heavily doped N-type source 56 and drain 58 regions formed in substrate 42 provide a conductive path for select transistor 44. In a similar manner, heavily doped N-type source 60 and drain 62 regions, along with channel region 48, form storage transistor 46. It is to be noted that cell 40 could also be formed in an N-type substrate wherein the polarities discussed would be reversed.

A first layer of polycrystalline silicon (polysilicon) approximately 270 nm thick is deposited on the upper surface of field region 52. The first polysilicon layer, which later becomes floating gate 64, extends over and substantially follows the contours defined by field region 52 and gate oxide layer 54. A electrically insulating layer 66 is provided on the upper surface of polysilicon layer 64. Layer 66 is preferably a silicon dioxide/silicon nitride/silicon dioxide (ONO) sandwich having a thickness of approximately 25 nm. Masking layer D is then used to define floating gate 64.

High voltage gate oxide layer 68 is grown on the surface of substrate 42 between source 56 and drain 58 of select transistor 44. Masking layer E is then used to dope gate oxide layer 68 so as to increase the threshold voltage of select transistor 44.

A second polysilicon layer, which will become control gate 70 and select gate 72, is deposited on the upper surface of the structure. After doping the second polysilicon layer, masking layer F is used to define control gate 70 and select gate 72. In the embodiment of FIG. 3, end 77 of control gate 70 extends over and laterally surrounds end 75 of floating gate 64.

Figure 5:
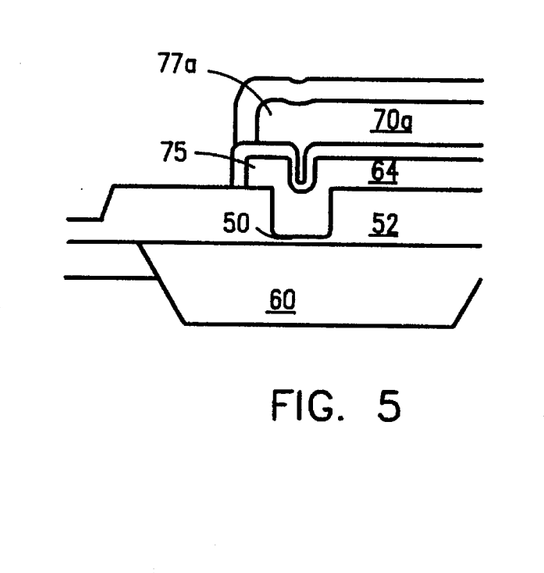
FIG. 5 is a cross-sectional view of a portion of an EEPROM cell in accordance with another embodiment of the present invention.

In another embodiment shown in FIG. 5, floating gate 64 is self aligned with control gate 70a such that end 75 of floating gate 64 is substantially flush with end 77a of control gate 70a. Note that the embodiment of FIG. 5 is identical in all respects to cell 40 of FIG. 3 except for end portion 77a of control gate 70a.

Referring again to the embodiment shown in FIG. 3, control gate 70 is etched in such a manner so as to leave a sliver region 74 of floating gate 64 protruding laterally beyond edge 76 of control gate 70. Sliver region 74 extends approximately one micron beyond edge 76 of control gate 70. Preferably, the length of sliver region 74 should be as minimal as modern photolithographic techniques allow.

After this etching step, seal oxide 78 is grown around sliver region 74 of floating gate 64 to replace portions of ONO layer 66 near sliver region 74 of floating gate 64 dissipated during the etching of control gate 70. Electrically insulating layer 80 may then be provided over control gate 70, followed by overlying successive layers of insulating glass 82 and 84. In one embodiment, for instance, glass layer 82 is formed of borophosphosilicate glass (BPSG) and glass layer 84 is formed of phosphosilicate glass (PSG).

Sliver region 74 described above provides protection against an attempted deprocessing of cell 40 using, for example, a chemical or plasma etching process as follows. In order to detect whether any charge is stored on floating gate 64, one must first gain access to floating gate 64 by removing control gate 70 (as well as insulating layers 66, 80). During such an attempted deprocessing, after removal of glass layers 82, 84, upon application of an etchant to remove insulating layer 80, the etchant will simultaneously eat through seal oxide 78 and the very thin ONO layer 66 over sliver region 74, thereby exposing sliver region 74 of floating gate 64 well before control gate 70 is etched through because insulating layer 80 is much thicker than ONO layer 66 and seal oxide 78. Ions present in the etchant will, upon contact with floating gate 64, immediately dissipate any charge stored on floating gate 64 thereby "erasing" floating gate 64. Thus, sliver region 74 prevents one from determining what the correct binary state of cell 40 was prior to the attempted deprocessing.

Figure 6:
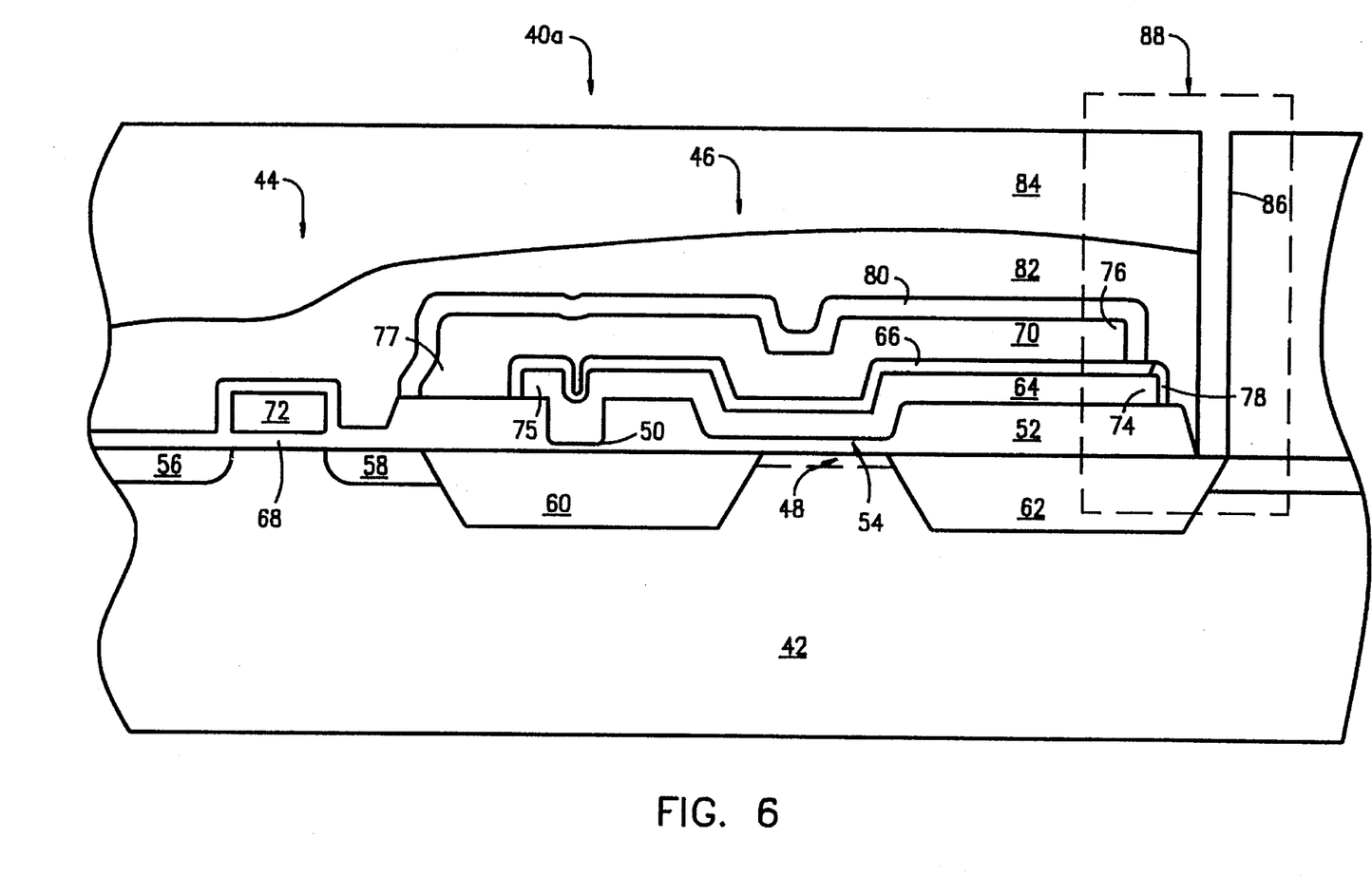
FIG. 6 is cross-sectional view of an another embodiment of the present invention.

FIG. 6 shows another embodiment of the present invention. The reading, writing, and erasing operations of cell 40a are identical in all respects to those of cell 40 shown in FIG. 3, and the description above relating to the embodiment of FIG. 3 applies equally to the embodiment of FIG. 6. Accordingly, those features in common to the embodiments of FIGS. 3 and 6 are denoted with the same numerals.

Referring to FIG. 4 as well as to FIG. 6, masking layer G is used either after (1) glass layer 82 is deposited or (2) after insulating layer 66 is formed to etch one or more cavities 86 in cell 40a. Preferably, each cavity 86 is one micron in diameter and extends in a substantially vertical direction in a region proximate to floating gate 64. Cavities 86 are not limited to a cylindrical shape, but may have a rectangular, octagonal, or any other suitable cross section.

After having been etched, cavities 86 are completely filled with a film 87 having a very high etching rate. This film 87 may be, for instance, an 8% phosphorous doped oxide film, or any other suitable material having an etching rate faster than that of the insulating material overlying the control gate. Referring to FIG. 6, cavities 86 provide protection against the external detection of charge stored on floating gate 64 as follows. As mentioned earlier, in order to gain access to and detect any charge stored on floating gate 64, one must first remove control gate 70. During such a deprocessing using, for example, a plasma or chemical etching process, the etchant will simultaneously attack glass layer 84 and a top portion of cavities 86. While glass layers 84, 82 and insulating layer 80 have a relatively slow etching rate, cavities 86, as mentioned earlier, are filled with a film 87 having a very high etching rate. The etchant etches not only down through the film 87 but to an extent laterally into the glass layers 84, 82 as the film 87 is etched downward, i.e., etching takes place both vertically and horizontally. Because the etching rate of the film 87 is greater than that of the glass layers 82, 84, the etchant will reach seal oxide 78 and etch therethrough to floating gate 64 prior to control gate 70 being removed. Hence any charge once present on floating gate 64 will be dissipated by the etchant before the etchant removes control gate 70. In other words, etchant deprocessing is ineffective for determining the binary state of cell 40a because the etchant will erase floating gate 64 before exposing control gate 70 for removal.

Figure 7:
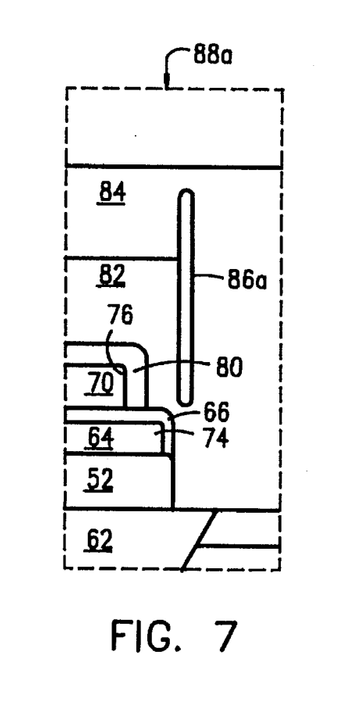
FIGS. 7–10 are partial cross-sectional views of other embodiments of the present invention.

Cavities 86 are shown in FIG. 6 to extend from a top surface of cell 40a to substrate 42 for purposes of clarity only. Indeed, the precise positioning and length of cavities 86 within outlined portion 88 of cell 40a may vary depending upon the specific characteristics of the EEPROM cell. Cavities 86 should preferably be placed as close to floating gate 64 as possible and should extend in an upward direction (i.e., towards the top surface of the EEPROM cell) and in a downward direction (i.e., towards substrate 42) a predetermined length sufficient to ensure that any etchant applied in an attempted deprocessing will reach and expose floating gate 64 via cavities 86 before exposing control gate 70 via electrically insulating layer 80. FIG. 7 shows one such possible positioning of cavities 86a, i.e., not extending to the top surface of cell 40a or to the substrate 42. Note that the various features of the embodiments of FIGS. 7–10 common with those of FIG. 6 are appropriately labelled with the same numbers.

Figure 8:
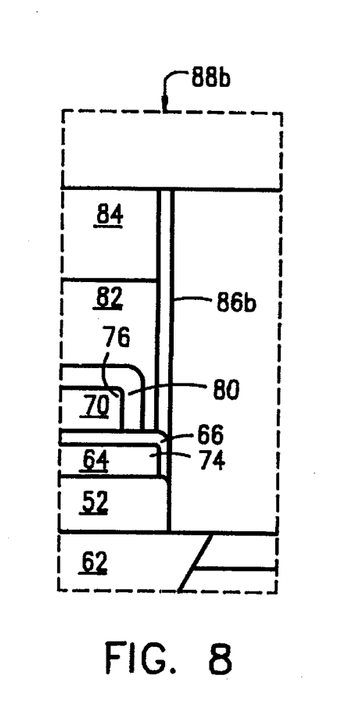

In another embodiment cavities 86b may overlap floating gate 64 so as to be above a portion of sliver region 74 of floating gate 64, as shown in FIG. 8.

Figure 9:
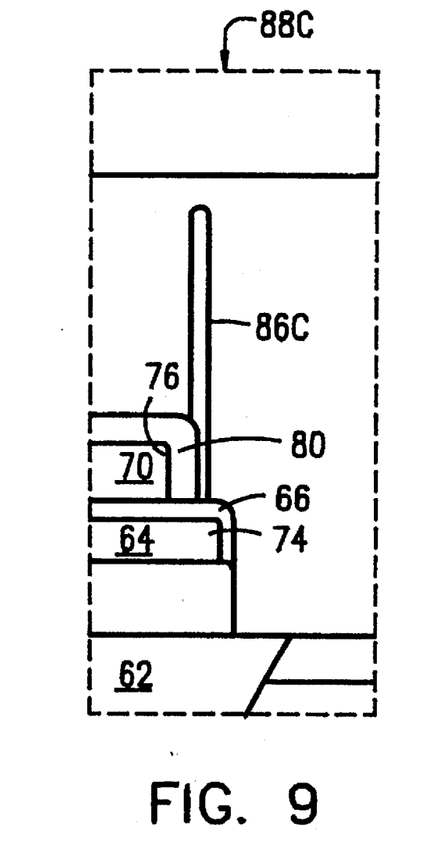

In yet another embodiment shown in FIG. 9, cavities 86c may be formed so as to overlap a portion of control gate 70.

The structure of sliver region 74 described above and shown in FIG. 6 provides additional security against charge detection via cell deprocessing. Sliver region 74 extends beyond end 76 of control gate 70 towards cavities 86, thereby reducing the distance between cavities 86 and floating gate 64. Accordingly, during an attempted deprocessing of cell 40a, the etchant will reach floating gate 64 via cavities 86 in even less time.

Figure 10:
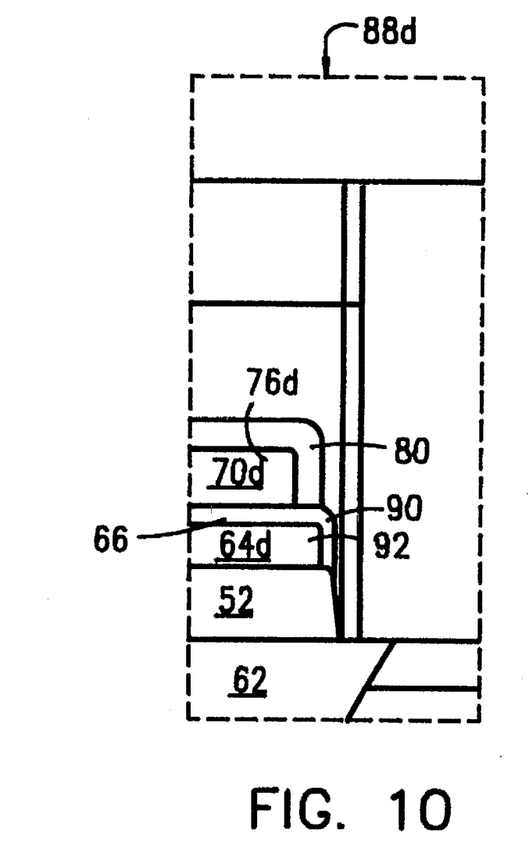

In another embodiment shown in FIG. 10 floating gate 64d is self aligned with control gate 70d. In the embodiment of FIG. 10, control gate 70d is etched in such a manner so as to remove portions of ONO layer 66 and floating gate 64d which extend beyond edge 76d of control gate 70d. A thin layer of seal oxide 90 is then thermally grown around edge 92 of floating gate 64d to replace portions of ONO layer 66 removed during the etching process. This self-aligning etching process results in edge 92 of floating gate 64d and edge 76d of control gate 70d being substantially flush with respect to one another. In one embodiment, seal oxide 92 has a relatively high etching rate so as to increase the speed with which the etchant eating through cavities 86 reaches and discharges floating gate 64d. The cavities 86 shown in the embodiment of FIG. 10 are formed in the same manner as are cavities 86 shown in the embodiment of FIG. 6, and may be of various lengths and widths and may be positioned in various regions adjacent floating gate 64d as described earlier and illustrated in FIGS. 7–9.

Figure 11:
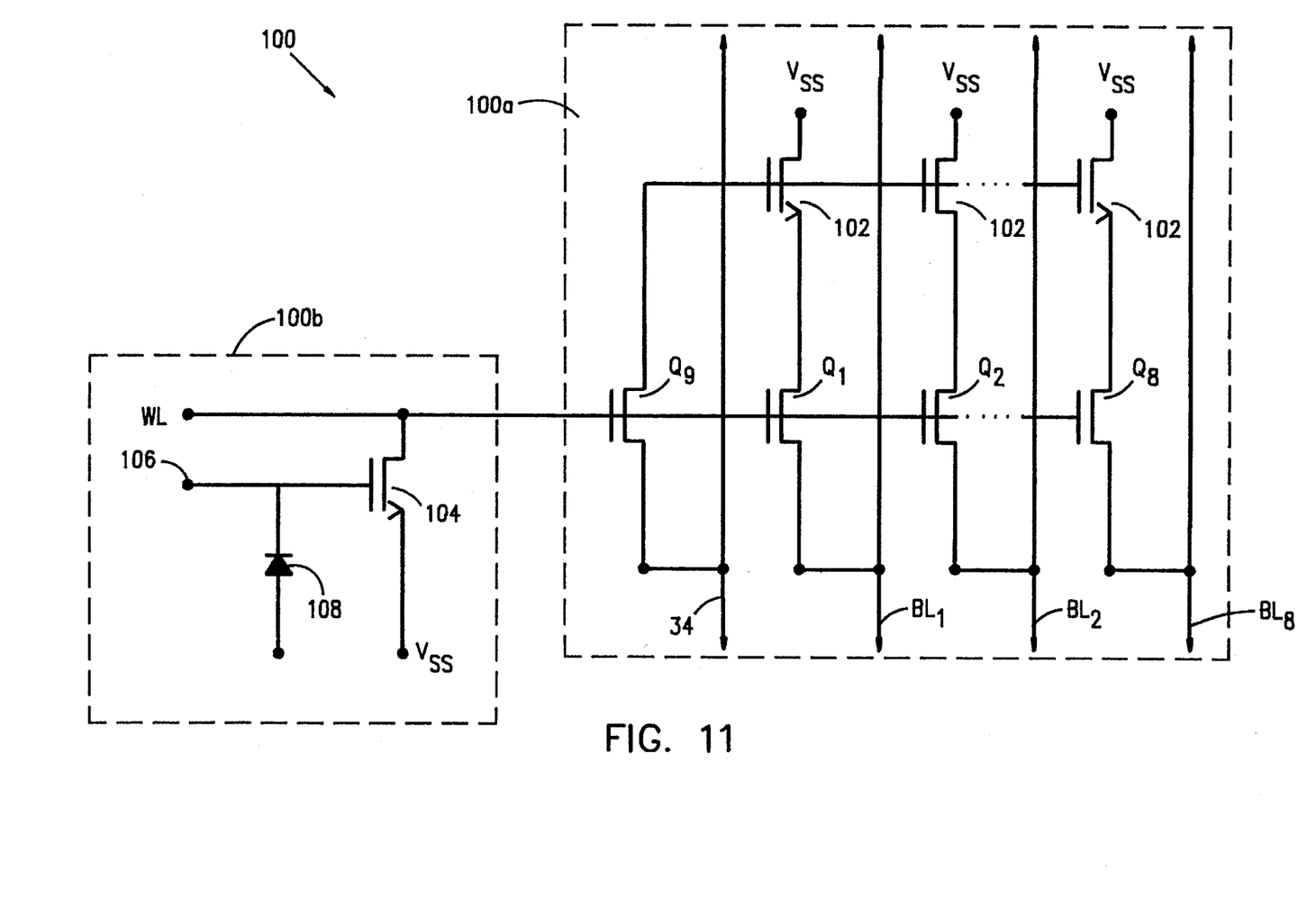
FIG. 11 is a schematic diagram of a portion of a memory array in accordance with the present invention.

Referring now to FIG. 11, EEPROM cells 102 are arranged in rows and columns in a non-volatile memory structure 100 having a cell array 100a and a protect circuit 100b. For simplicity, only a portion of memory structure 100 is shown in FIG. 11. It is to be understood, however, that in actual practice memory structure 100 may contain hundreds or even thousands of rows and/or columns of cells 102. The reading, writing, and erasing operations of cell array 100a are similar to that of prior art memory array 32 (FIG. 2) and thus will not be discussed below. Accordingly, those features common to cell array 100a disclosed herein and to prior art array 32 are labelled with the same numerals.

In the preferred embodiment, EEPROM cells 40a (FIG. 6) are employed as memory cells 102 in cell array 100a (FIG. 11) for reasons discussed above. Additional advantages of employing cell 40a as cell 102 in cell array 100a will become apparent shortly. It is to be understood, however, that the advantages of memory structure 100, as discussed below with reference to FIGS. 11–14, may still be realized even where cells 102 are conventional memory cells.

One attempting to externally gain access to cells 102 in order to electrically determine the binary states thereof would have to deprocess memory structure 100 so as to expose word line WL, bit lines $BL_1$–$BL_8$, and control line 34 for applying appropriate read voltages via microprobing (FIG. 11). In the preferred embodiment, word lines WL of memory structure 100 and control gates 70 of memory cells 102 are formed on the same poly-silicon layer. Thus, using an etchant to deprocess memory structure 100 in order to expose word lines WL would, as discussed above with regard to cells 40, 40a and FIGS. 3–10, result in floating gates 64 of memory cells 102 discharging before word lines WL are sufficiently exposed for microprobing. In other words, such an attempt to externally access cells 102 is ineffective since the etchant would reach and discharge floating gate 64 of cell 102 via cavity 86 and/or sliver region 74 before word lines WL could be exposed for microprobing.

Figure 12:
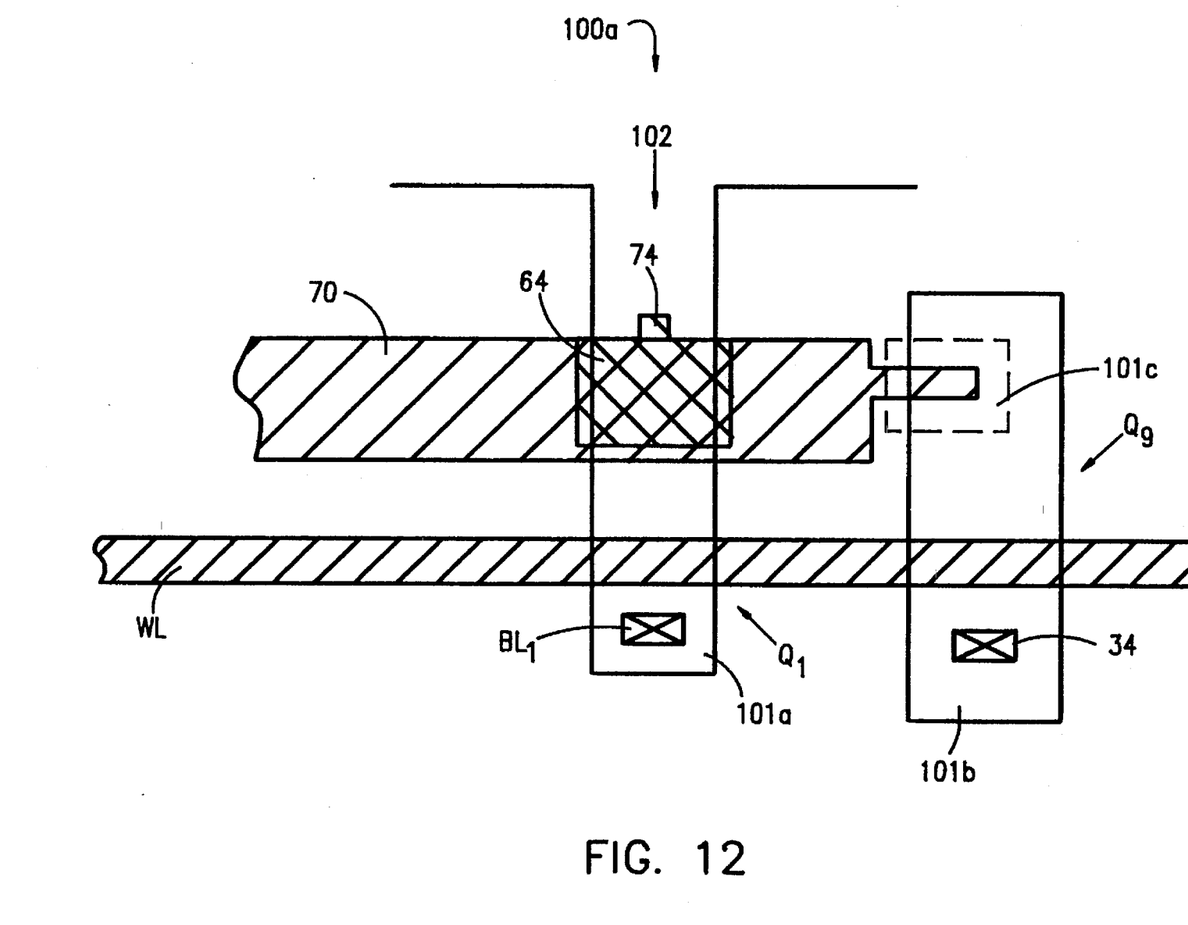
FIG. 12 is a plan view of one portion of the memory array of FIG. 11.
Figure 13:
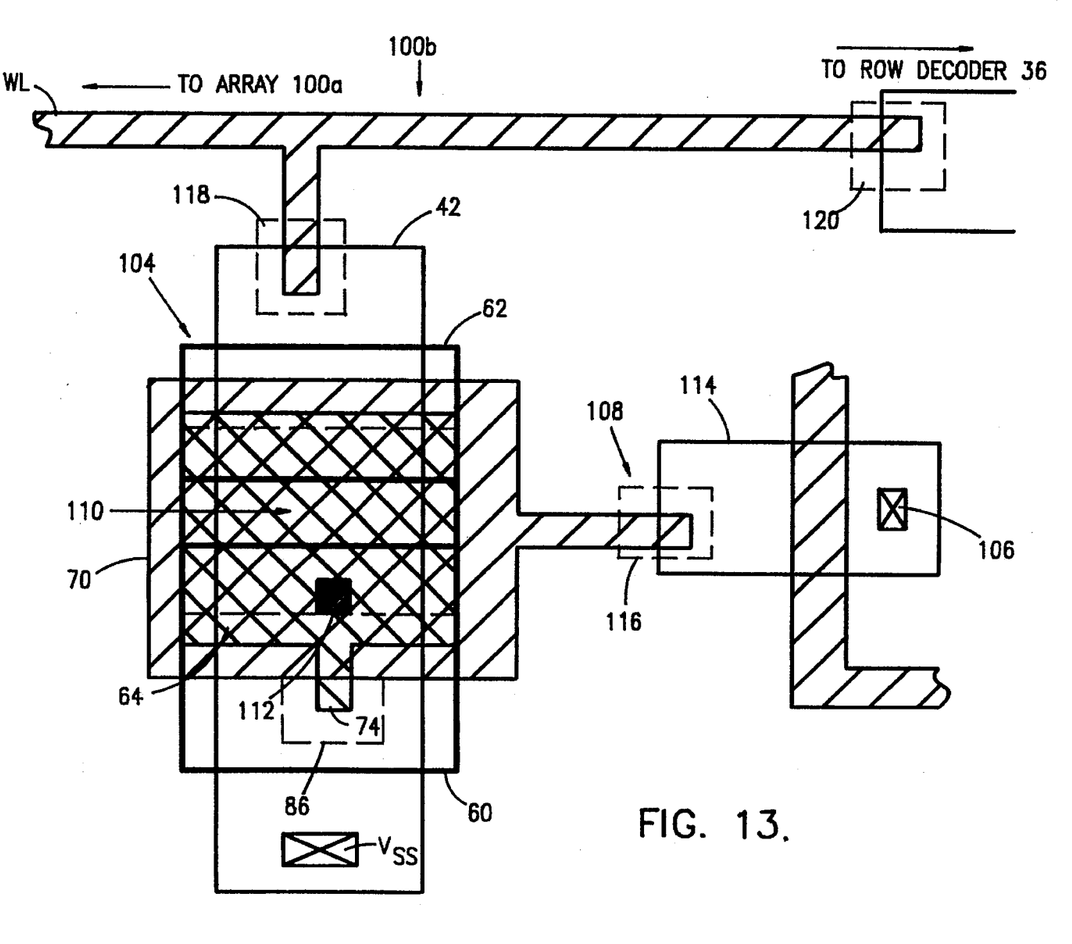
FIG. 13 is a cross-sectional view of that portion of the memory array shown in FIG. 12.

Further, the connections between control gate 70 of each memory cell 102 are advantageously realized at the substrate level. FIG. 12 shows a plan view of a portion of cell array 100a, where cell 102, select transistor $Q_1$, and control transistor $Q_9$ are preferably contained in a monolithic P type semiconductor substrate 101. Referring also to FIG. 13, which shows a cross-sectional view of that portion of cell array 100c illustrated in FIG. 12, control gate 70 of cell 102 is connected to a source 101b of control transistor $Q_9$ (and thus indirectly connected to control line 34) by a buried N+ region 101c formed within substrate 101. In the preferred embodiment, a portion of buried N+ region 101c underlies source 101b of control transistor $Q_9$ (and thus, the connection between control gate 70 and control transistor $Q_9$, rather than involving contacts at a metallization layer, is realized at the substrate level and, accordingly, cannot be directly accessed.

Protect circuit 100b further prevents unauthorized external access to data stored within cells 102 (FIG. 11). Protect circuit 100b includes an EEPROM cell 104 having its drain connected to word line WL of cell array 100a and having its source connected to a voltage supply $V_{ss}$ (i.e., ground potential). The gate of cell 104 is connected to a security node 106. A diode 108 has a cathode connected to security node 106 and an anode connected to $V_{ss}$. It is to be understood that each word line WL within cell array 100a has coupled thereto an associated protect circuit 100b.

In one embodiment, cell 104 may be a modified version of EEPROM cell 40a (FIG. 6). Referring to FIG. 13, which shows a plan view of protect circuit 100b, and also to FIG. 6, cell 104 may be fabricated as follows. EEPROM cell 40a (FIG. 6) is modified to be a depletion-type MOS device by implanting N-type dopants such as Phosphorus into channel region 48 using any conventional means. The resultant EEPROM cell 104 (FIG. 13) thus has a depletion channel 110 extending between source 60 and drain 62, and should preferably have, in its natural (uncharged) state, a threshold voltage $V_T$ of approximately −3 V. Also unlike cell 40a (FIG. 6), in which electron tunneling occurs near drain 62, electron tunneling occurs near source 60 of cell 104, as indicated by box 112.

Preferably, diode 108 is an MOS device as shown in FIG. 13, where a P well 114 serves as the anode and a N+ buried region 116 formed within P well 114 serves as the cathode. Control gate 70 of cell 104 is etched in such a way so as to overlap a portion of P well 114 and to contact buried N+ region 116. Word line WL, which is preferably poly-silicon, is connected to drain 62 of cell 104 via a buried N+ region 118 formed within a region of P+ substrate 42 proximate to drain 62 of cell 104. Word line WL is similarly connected to a row decoder 36 via buried N+ region 120.

Referring now to FIGS. 11–13, protect circuit 100b prevents the unauthorized electrical reading of data stored within cell array 100a as follows. Security node 106 is connected to ground potential. During power-up of memory structure 100, a 10 ms pulse of 15 V is applied to security node 106 with word line WL floating. This 15 V pulse appears at control gate 70 of cell 104 and causes electron tunnelling between source 60 and floating gate 64, thereby resulting in an accumulation of negative charge on floating gate 64. This accumulation of charge increases the threshold voltage $V_T$ of cell 104 to approximately 2 V. After application of the 15 V pulse, security node 106 and control gate 70 of cell 104 are maintained at ground potential. As long as floating gate 64 of cell 104 remains charged such that the $V_T$ of cell 104 is positive, cell 104 will remain in a non-conductive state and cell array 100a will operate in a normal manner (i.e., in a manner irrespective of protect circuit 100b).

As mentioned earlier, in order to electrically read data stored within cell array 100b of memory structure 100 without internal access, one must deprocess memory structure 100 and remove enough passivation layers of memory structure 100 to expose control line 34, word line WL, and bit lines $BL_1$–$BL_8$. However, during such a deprocessing to expose these lines using, for example, a plasma or chemical etching process, the etchant will simultaneously attack a top portion of cavity 86 of cell 104. As mentioned earlier, cavity 86 is filled with a film 87 having an etching rate much greater than that of the passivation layers (not shown) provided within array structure 100. Thus any etchant applied to memory structure 100 in such a deprocessing attempt will, rapidly eating through film 87 provided within cavity 86 of cell 104, reach and expose floating gate 64 of cell 104 prior to fully exposing control line 34, word line WL, and bit lines $BL_1$–$BL_8$. Accordingly, any charge once present on floating gate 64 of cell 104 will be dissipated by the etchant before sufficient access is gained to enable reading of data stored within cell array 100$a$.

Once floating gate 64 of cell 104 has been discharged, the threshold voltage $V_T$ of cell 104 returns to −3 V. Since the control gate of cell 104 is grounded via security node 106, cell 104 turns on and pulls its associated word line WL to ground potential. Cell 104, acting as a short between word line WL and ground, prevents the application of an appropriate read voltage (i.e., approximately 5 V) from being applied to word line WL to turn on select transistors $Q_1$–$Q_8$. Thus, none of select transistors $Q_1$–$Q_8$ can be turned on and, accordingly, none of memory cells 102 can be accessed. In other word, maintaining word line WL at ground potential prevents one from accessing and electrically reading data stored within cell array 100$a$.

Diode 108 ensures that cell 104 cannot be turned off so as to enable electrical reading of data stored in cell array 100$a$. If one attempts to turn off cell 104 by applying a sufficiently negative voltage to security node 106, diode 108 turns on and pulls security node 106 to approximately −0.6 V (e.g., one diode drop below ground), thereby preventing cell 104 from being turned off and, accordingly, ensuring that word line WL remains at ground potential.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

We claim:

1. A non-volatile memory structure comprising:

an array of memory cells arranged in a plurality of rows and a plurality of columns, each of said memory cells comprising an MOS transistor;

a plurality of word lines, each being associated with one of said rows of said memory cells;

a plurality of bit lines, each being associated with one of said columns of said memory cells; and a plurality of security structures, each being coupled to an associated word line, wherein the security structure comprises:

an EEPROM cell having a drain connected to said associated word line, a source coupled to a voltage supply, and a control gate coupled to a security node; and a diode having a cathode connected to said control gate of said EEPROM cell and having an anode connected to said voltage supply.

2. The structure of claim 1 wherein said EEPROM cell comprises:

a semiconductor substrate having a channel region extending between said source and said drain;

a first electrically insulating layer overlying said substrate;

a floating gate overlying said first electrically insulating layer;

a second electrically insulating layer overlying said floating gate, said control gate overlying said second insulating layer; and a third insulating layer overlying said control gate, said third insulating layer defining a cavity positioned in a region proximate to an end of said floating gate, said cavity having therein a film having a higher etching rate than the third insulating layer.

3. The structure of claim 2 wherein said end of said floating gate further comprises a sliver region, said sliver region extending beyond an end of said control gate.

4. The structure of claim 3 wherein said sliver region extends beyond the end of the control gate less than one micron.

5. The structure of claim 2 wherein said EEPROM cell is a depletion-type MOS transistor.

6. The structure of claim 5 wherein said EEPROM cell has a threshold voltage of less than zero.

7. The structure of claim 5 wherein said EEPROM cell has a threshold voltage of approximately −3 volts.

8. The structure of claim 3 wherein said diode comprises:

a semiconductor material of a first conductivity type serving as said anode of said diode; and a buried region of a second conductivity type formed in said semiconductor material serving as said cathode of said diode, wherein said control gate of said EEPROM cell contacts said buried region.

9. The structure of claim 3 wherein said EEPROM cell further comprises a buried region formed in a region of said semiconductor substrate proximate to said drain, said word line being coupled to said buried region.

10. The structure of claim 3 wherein said each of said memory cells comprises said EEPROM cell.

11. A non-volatile memory structure comprising:

a storage transistor having a source, a drain, and a control gate;

a select transistor having a source, a drain, and a control gate, said source being connected to said drain of said storage transistor;

a control transistor having a source, a drain, and a control gate, said source having formed therein a buried region, wherein said control gate of said storage transistor contacts said buried region;

a word line connected to said control gate of said control transistor and to said control gate of said select transistor; and an EEPROM cell having a drain connected to said word line, a source coupled to a voltage supply, and a control gate coupled to a security node.

12. The structure of claim 11 further comprising a bit line connected to said drain of said select transistor.

13. The structure of claim 12 further comprising a control line connected to said drain of said control transistor.

14. The structure of claim 11 wherein said storage transistor comprises an EEPROM cell.

15. The structure of claim 14 wherein said EEPROM cell further comprises:

a semiconductor substrate having formed therein said source and said drain, said substrate having a channel region extending between said source and said drain;

a first electrically insulating layer overlying said substrate;

a floating gate overlying said first electrically insulating layer;

a second electrically insulating layer overlying said floating gate, said control gate overlying said second insulating layer; and a third insulating layer overlying said control gate, said third insulating layer defining a cavity positioned in a region proximate to an end of said floating gate, said cavity having therein a film having a higher etching rate than the third insulating layer.

16. The structure of claim 15 wherein said end of said floating gate further comprises a sliver region, said sliver region extending beyond an end of said control gate.

17. The structure of claim 16 wherein said sliver region extends beyond the end of the control gate less than one micron.

18. The structure of claim 11 further comprising:

an EEPROM cell having a drain connected to said word line, a source coupled to a voltage supply, and a control gate coupled to a security node; and a diode having a cathode connected to said control gate of said EEPROM cell and having an anode connected to said voltage supply.

19. The structure of claim 18, wherein said EEPROM cell further comprises:

a semiconductor substrate having a channel region extending between said source and said drain;

a first electrically insulating layer overlying said substrate;

a floating gate overlying said first electrically insulating layer;

a second electrically insulating layer overlying said floating gate, said control gate overlying said second insulating layer; and a third insulating layer overlying said control gate, said third insulating layer defining a cavity positioned in a region proximate to an end of said floating gate, said cavity having therein a film having a higher etching rate than the third insulating layer.

20. The structure of claim 19 wherein said end of said floating gate further comprises a sliver region, said sliver region extending beyond an end of said control gate.

21. The structure of claim 20 wherein said sliver region extends beyond the end of the control gate less than one micron.

22. The structure of claim 21 wherein said EEPROM cell is a depletion-type MOS transistor.

23. The structure of claim 22 wherein said EEPROM cell has a threshold voltage of less than zero.

24. The structure of claim 23 wherein said EEPROM cell has a threshold voltage of approximately −3 volts.

* * * * *